United States Patent
Rao

(10) Patent No.: US 8,643,516 B1
(45) Date of Patent: Feb. 4, 2014

(54) PARALLEL-TO-SERIAL CONVERTER

(71) Applicant: Venkata N. S. N. Rao, Fremont, CA (US)

(72) Inventor: Venkata N. S. N. Rao, Fremont, CA (US)

(73) Assignee: Kool Chip, Inc., San Jose, CA (US)

( * ) Notice: Subject to any disclaimer, the term of this patent is extended or adjusted under 35 U.S.C. 154(b) by 0 days.

(21) Appl. No.: 13/669,137

(22) Filed: Nov. 5, 2012

(51) Int. Cl.
*H03M 9/00* (2006.01)

(52) U.S. Cl.
USPC .......................................... 341/101; 341/100

(58) Field of Classification Search
USPC ................................. 341/100, 101
See application file for complete search history.

(56) References Cited

U.S. PATENT DOCUMENTS

| | | | | |
|---|---|---|---|---|
| 6,608,576 B1 * | 8/2003 | Borgen | .......................... | 341/143 |
| 7,215,263 B2 * | 5/2007 | Dietrich et al. | ................ | 341/101 |
| 7,719,450 B2 * | 5/2010 | Huber et al. | ................... | 341/101 |
| 8,462,028 B2 * | 6/2013 | Kashiwakura | ................. | 341/101 |

* cited by examiner

Primary Examiner — Brian Young
(74) Attorney, Agent, or Firm — Venture Pacific Law, PC

(57) ABSTRACT

A method for converting parallel data having a certain word size to serial data, comprises the steps of: loading a first segment of a word of the parallel data into a shift register having a first size, and inputting remaining segments of the word into two or more multiplexers connected in series for selecting a next segment of the word; selecting the next segment of the word to load into the shift register; shifting out the loaded segment of the word in the shift register as serial data output; loading the selected next segment of the word into the shift register; and repeating the selecting, shifting, and loading the next segment steps until all the remaining segments of the word have been shifted as serial data output.

19 Claims, 5 Drawing Sheets

US 8,643,516 B1

PARALLEL-TO-SERIAL CONVERTER

FIELD OF INVENTION

This invention generally relates to a parallel-to-serial converter and, in particular, to a parallel-to-serial converter using one or more multiplexers for selecting segments of a parallel data word to be serially outputted.

BACKGROUND

Parallel-to-serial converters are used across various computing devices and for various applications. For instance in DDR-DRAM semiconductor memories, a double data rate input to semiconductor memory is converted internally into a single data rate and written in parallel to the semiconductor memory. For a read access, the stored data in the semiconductor memory that is stored in parallel is converted into a serial data stream for output. An interface circuit of the semiconductor memory is equipped with a parallel-to-serial converter for such conversions.

In the simplest case, a parallel-serial converter is designed as a controllable shift register. The parallel-to-serial converter has a number of cascade-connected flip-flops corresponding to the number of input terminals. Furthermore, a control signal generated by means of a multiplexer may be provided for controlling the shift register. The construction and the method of operation of such a parallel-to-serial converter designed as a controllable shift register are known in many instances.

For a typical parallel-to-serial converter, the single multiplexer is used for parallel loading of an entire N-bit word into a shift register. The shift register then shifts the loaded data to generate serial data. After the N-bit word is shifted out, another N-bit word is retrieved for parallel loading into the shift register. The latency of such parallel-to-serial converter is very low due to its simplicity. However, the amount of power used to operate such parallel-to-serial converter is quite high. Therefore, there remains a desire for providing a parallel-to-serial converter that has low latency and low power consumption.

SUMMARY OF INVENTION

An object of this invention is to provide a low power parallel-to-serial converter.

Another object of this invention is to provide a parallel-to-serial converter that has low latency.

Yet another object of this invention is to provide a parallel-to-serial converter that supports multiple word widths.

Briefly, the present invention discloses methods and systems for converting parallel data having a certain word size to serial data, comprises the steps of: loading a first segment of a word of the parallel data into a shift register having a first size, and inputting remaining segments of the word into two or more multiplexers connected in series for selecting a next segment of the word; selecting the next segment of the word to load into the shift register; shifting out the loaded segment of the word in the shift register as serial data output; loading the selected next segment of the word into the shift register; and repeating the selecting, shifting, and loading the next segment steps until all the remaining segments of the word have been shifted as serial data output.

An advantage of this invention is that a low power parallel-to-serial converter is provided.

Another advantage of this invention is that a parallel-to-serial converter that has low latency is provided.

Yet another advantage of this invention is that a parallel-to-serial converter that supports multiple word widths is provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

A parallel-to-serial converter of the present invention converts a parallel data word to serial data by loading segments of the word into a shift register for serial data output. For instance, the first segment of a word is loaded into a shift register. Simultaneously, a next segment of the word is determined and readied to be loaded to the shift register. The currently loaded segment of the word in the shift register is shifted out for serial data output. The next segment of the word that was readied is loaded into the shift register. The determining, shifting, and loading the next segment steps are repeated until all the bits of the word have been shifted for serial data output.

Figure 1:
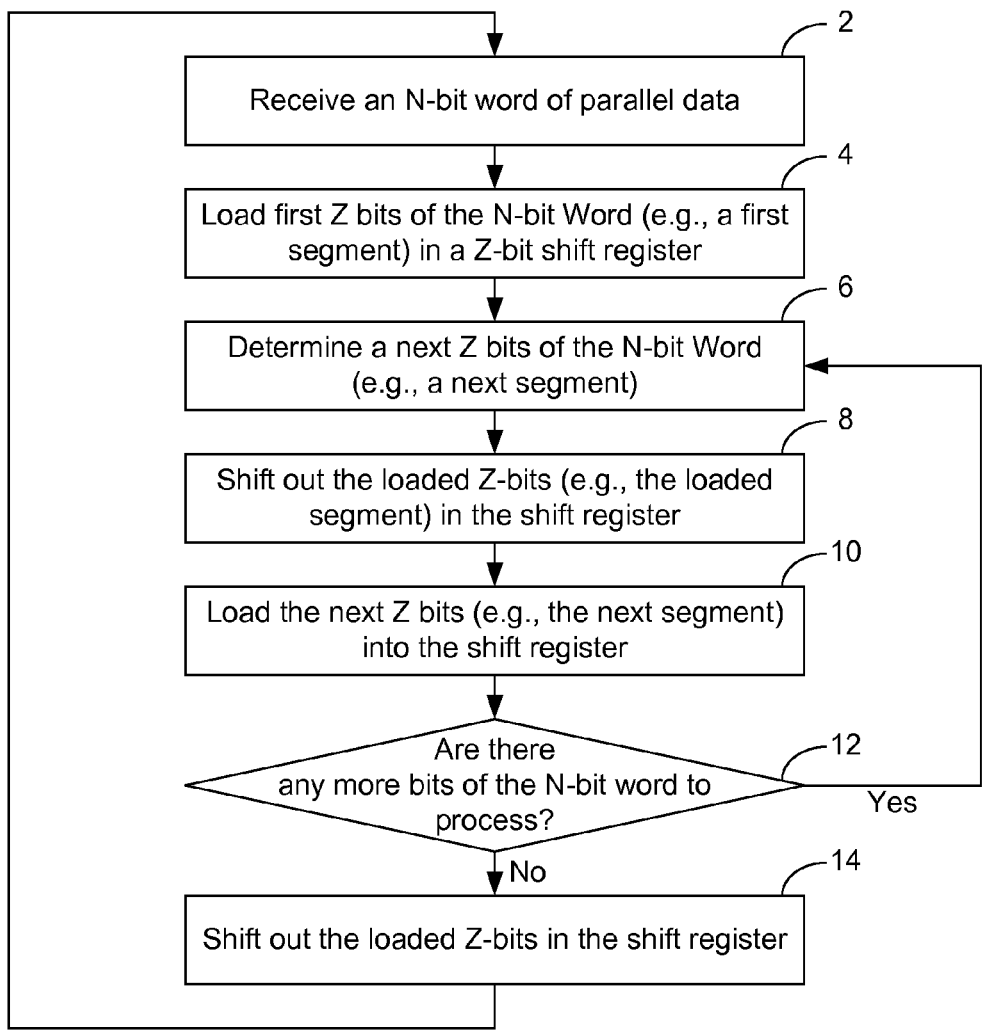
FIG. 1 illustrates a flow chart of the present invention for converting an N-bit word of parallel data to serial data.

FIG. 1 illustrates a flow chart of the present invention for converting an N-bit word of parallel data to serial data. A parallel-to-serial converter of the present invention can receive an N-bit word of parallel data 2. The N-bit word is processed for serial output by processing Z-bit segments of the N-bit word, where Z is less than N. The first Z bits of the N-bit word (e.g., a first segment) are directly loaded in a Z-bit shift register 4. The next Z-bits of the N-bit word (e.g., a next segment) are simultaneously processed 6 for loading into the Z-bit shift register. The loaded Z bits in the shift register are shifted out 8. Simultaneously, the next Z-bits (e.g., the next segment readied for loading) are loaded into the Z-bit shift register 10. Thus, as the first Z-bits are shifted out, the next Z-bits of the N-bit word (or remaining bits of the N-bit word) are loaded into the shift register such that that serial transmission of data does not suffer from additional latency. It is important to note that the next segment of the word can be less than Z bits since the N-bit word may not be a multiple number of bits of Z. As such, the loaded bits in the shift register may also be less than Z bits for the last segment of the word.

Next, it is determined whether there are any more bits of the N-bit word to process 12. If so, a next segment of Z or less bits of the N-bit word is processed 6, and the following steps 8, 10, 12, and 6 repeat until there are no more segments or bits to process in the N-bit word. Thus, consecutive segments of the word can be loaded into the shift register 34 for serial data output according to one or more control signals. If not, the loaded bits in the shift register are shifted out 14, and a next word of parallel data is received 2 for conversion to serial data. It is important to note that the bit size of a next word may not be the same bit size as the previous inputted word. In such case, the process flow is similar. However, the total number of segments of the next word may be more or less than the previously inputted word of parallel data.

Figure 2:
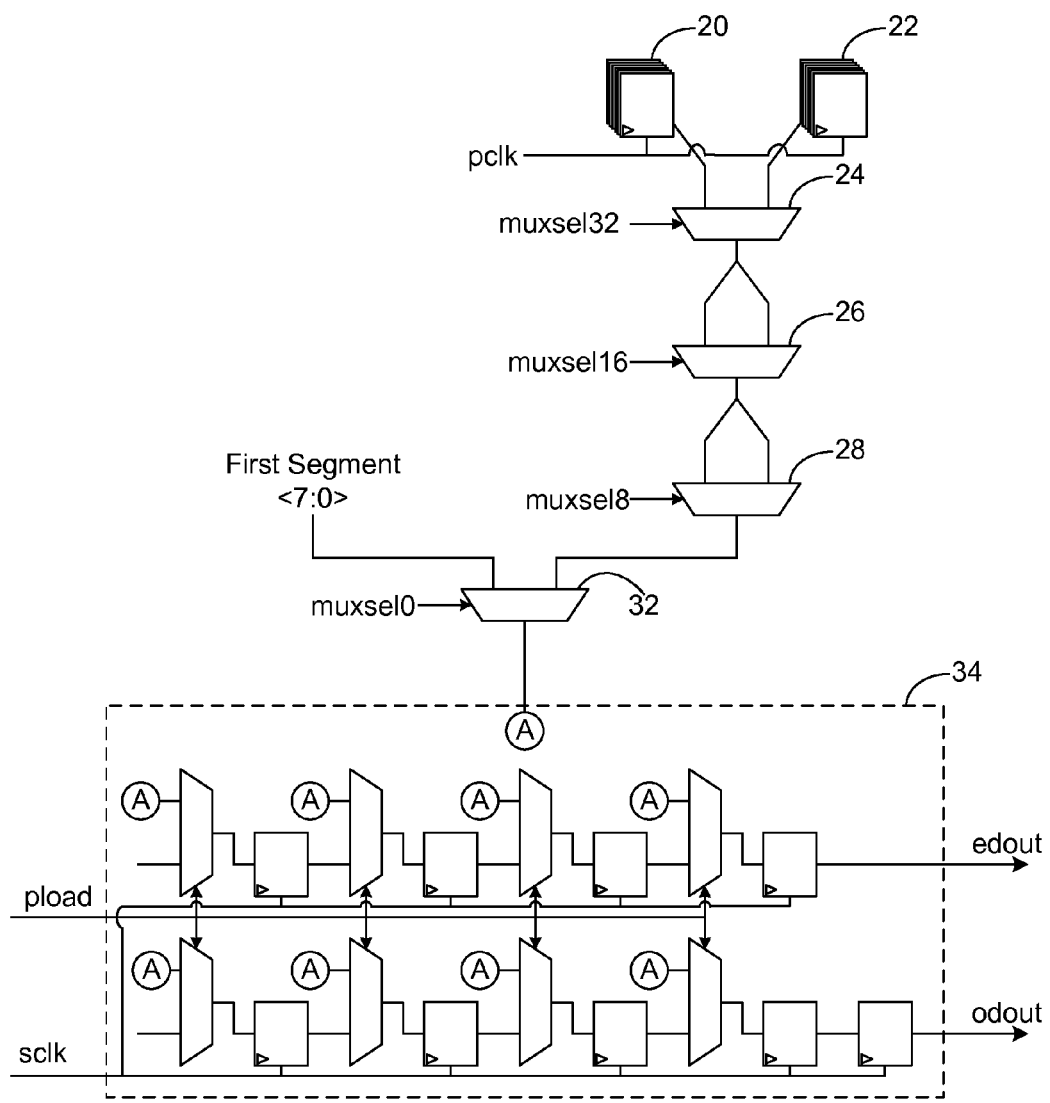
FIG. 2 illustrates a parallel-to-serial converter of the present invention.

FIG. 2 illustrates a parallel-to-serial converter of the present invention in a non-FIFO mode. A parallel-to-serial converter of the present invention comprises flip-flops 20 and 22, multiplexers 24-32, and a shift register 34. The shift register 34 can further comprise other flip-flops and multiplexers for serially driving even data edout and odd data odout according to a clock signal sclk and a control signal pload.

The parallel-to-serial converter of the present invention can be configured to handle any N-bit word for serial output. For example, if a 72-bit word is to be serially outputted by the parallel-to-serial converter of the present invention, the first 8 bits of the word (i.e., a first segment of the word) is directly loaded to the shift register 34 via the multiplexer 32, and then shifted by the shift register 34. The remaining 64 bits of the word (also referred to as remaining segments of the word) can be received by the flip-flops 20 and 22, wherein the clock pclk latches the 64 bits to the flip-flops 20 and 22. The first 32 bits can be stored in the flip-flop 20 and the remaining 32 bits can be stored in the flip-flop 22.

The flip-flops 20 and 22 are connected to the input of the multiplexer 24 for selecting 32 bits, either from the flip-flop 20 or from the flip-flop 22. A control signal muxsel32 can control which of the two 32 bits to output from the multiplexer 24. The multiplexer 26 receives the selected 32 bits as input, and then selects 16 bits to output according to a control signal muxsel16. The selected 16 bits that are outputted from the multiplexer 26 is inputted to the multiplexer 28. The multiplexer 18 selects 8 bits of the inputted 16 bits according to a control signal muxsel8, and outputs the selected 8 bits to the multiplexer 32 for parallel loading to the shift register 34. The amount of time for loading a segment of 8 bits from the 72-bit word to the shift register 34 via the multiplexers 24-32 is less than the time it takes to serially transmit the previous loaded 8 bits in the shifter register 34. Thus, the serial outputs edout and odout can serially transmit the 72-bit word in 8-bit segments with very little to zero delay between each serially transmitted bit and between each serially transmitted segment.

During the shifting of the first 8 bits of the 72-bit word, the remaining 64 bits are prepared and loaded into the shift register 24 in 8 bit segments via the multiplexers 24-32. Each of the 8 bit segments can be consecutively loaded in the shift register 34, and then shifted by the shift register 34 for serial output. This process continues until the entire 72-bit word is serially outputted as even and odd serial data.

The multiplexers 24-28 are serially connected for selecting the next segment of the word from the remaining segments of the word. The number of the multiplexers 24-28 can be a function of the word size and the bit size of the shift register 34. For instance, the number of the multiplexers 24-28 can be determined by the following formula: two to the x power=y, where y=(the word size−the size of the first segment)/the bit size of the shift register.

In case the data width is not a multiple of 8 bits (i.e., the shift register size), the remainder of the bits of the word can be directly loaded into the multiplexer 32 when the remainder of the bits is ready to be loaded. For instance, in the case of a 10 bit word, the first 8 bits are loaded into the shift register 34. While the first 8 bits of the word is shifted out, the remaining 2 bits can be inputted to multiplexer 32 to be loaded in the shift register 34. Once the first 8 bits are shifted out, the remaining 2 bits can be shifted in without any frequency penalty. This re-arrangement is required to ensure continuous flow of parallel to serial data. Otherwise if the remaining 2 bits of the word go through the multiplexers 24-28, then the speed of operation of the parallel-to-serial converter would be negatively impacted. By loading the remaining 2 bits of the parallel data word to the multiplexer 32, the overall latency is reduced since the multiplexers 24-28 are not used in such case.

Generally, in the non-FIFO mode, data received on cycle-N of the clock signal pclk will be serialized in N-cycle only. Delay between the clock signal pclk's rising edge to zero-ith bit of serial data is programmable and is anywhere between 4 unit intervals ("UI") to the word size minus 1 UI.

It is understood that the above cases are merely examples of various different word widths that can be used in conjunction with the present invention. In fact, parallel data words of varying bit widths can be processed for serial transmission using a parallel-to-serial converter of the present invention. It is also understood that such other embodiments of present invention are readily understood from the detailed description of the present invention.

Figure 3:
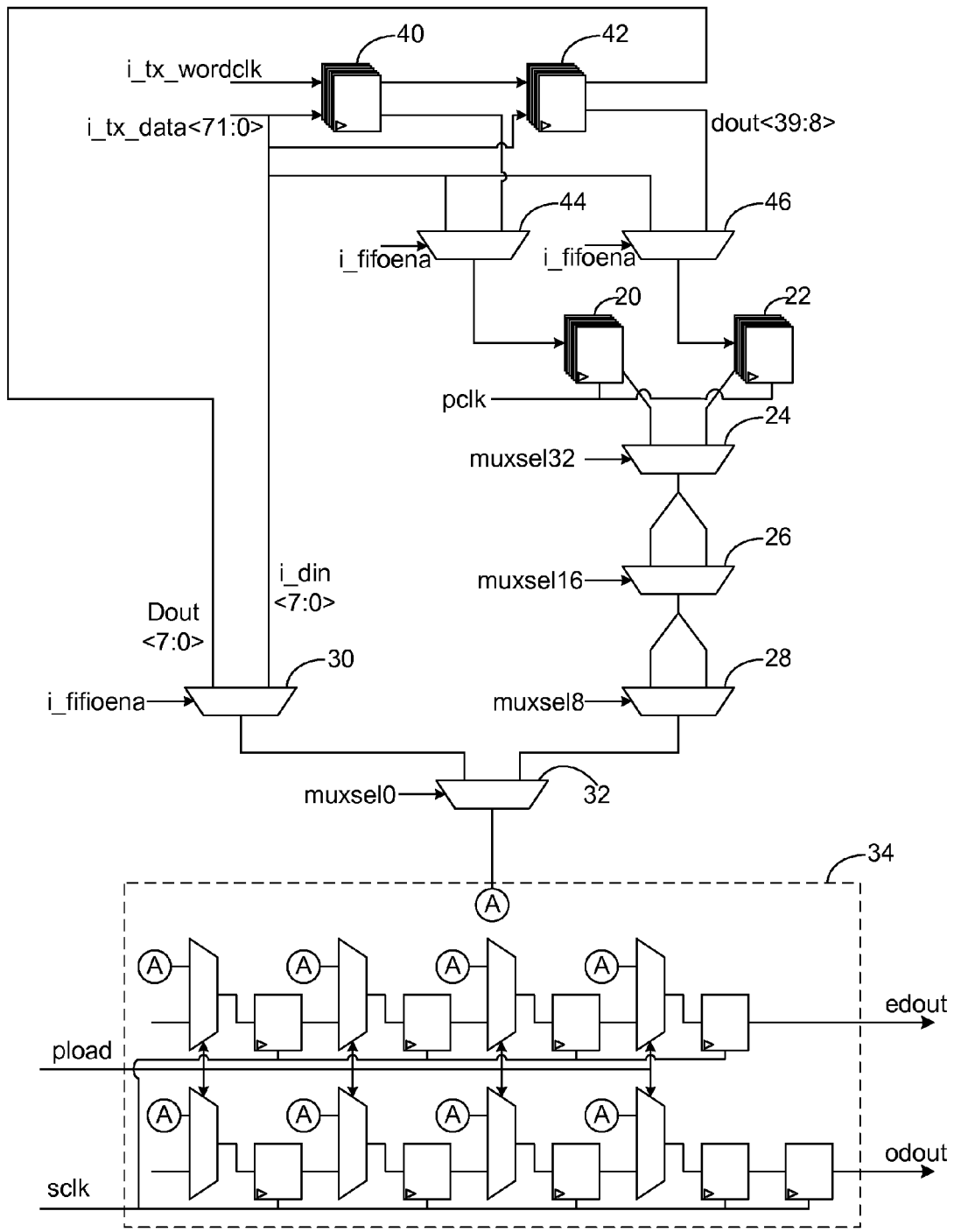
FIG. 3 illustrates a parallel-to-serial converter of the present invention having a FIFO mode.

FIG. 3 illustrates a parallel-to-serial converter of the present invention having a FIFO mode. A parallel-to-serial converter of the present invention can have a FIFO mode enabled. The parallel-to-serial converter of the present invention comprises the flip-flops 20 and 22, the multiplexers 24-32, the shift register 34, additional flip-flops 40 and 42, and additional multiplexers 44 and 46.

In FIFO mode, the data is routed through the additional flip-flops 40 and 42 using a clock signal i_tx_wordclk. The clock signal pclk is an internally delayed version of the clock signal i_tx_wordclk. FIFO mode adds another pclk latency by having the received input data stored in the flops 40 and 42. The storage of an additional N-bit word enhances the stability of the system. The delay between data to the zero-ith bit of the serial data is from the word size plus 4 UI to two times the word size minus 1.

For instance, input word i_tx_data<71:0> is inputted to the flip-flops 40 and 42 and the multiplexers 44 and 46. The first segment of the word, i_din <7:0>, is inputted to the multiplexer 30. The clock signal i_tx_wordclk is inputted to the flip-flops 40 and 42 for latching the input word. The bits <39:8> of the input word is inputted to the multiplexer 46 from the flip-flop 42. The input word is also inputted to the multiplexer 46. The bits <71:40> of the input word is inputted to the multiplexer 44 from the flip-flop 40. The input word is also inputted to the multiplexer 40. Additionally, the flip-flop 42 inputs the first 8 bits of the input word, Dout <7:0> to the multiplexer 30.

If a control signal, i_fifoena, is enabled, then the multiplexer 30 selects the Dout<7:0> input, the multiplexer 44 selects the input bits from the flip-flop 40, and the multiplexer 46 selects the input bits from the flip-flop 42.

If the control signal i_fifo_ena, is disabled, then the multiplexer 30 selects the i_din<7:0> input, the multiplexer 44 selects the input bits from the input word, and the multiplexer 46 selects the input bits from the input word. The flip-flops 40 and 42 can be disabled to save power since the input word can be directly inputted to multiplexers 44 and 46.

In both cases, the multiplexer 44 loads the flip-flops 20 and the multiplexer 46 loads the flip-flop 22. After this, the operation of the parallel-to-serial converter is similar to the previous embodiment illustrated in FIGS. 1 and 2 for loading a next segment.

Figure 4:
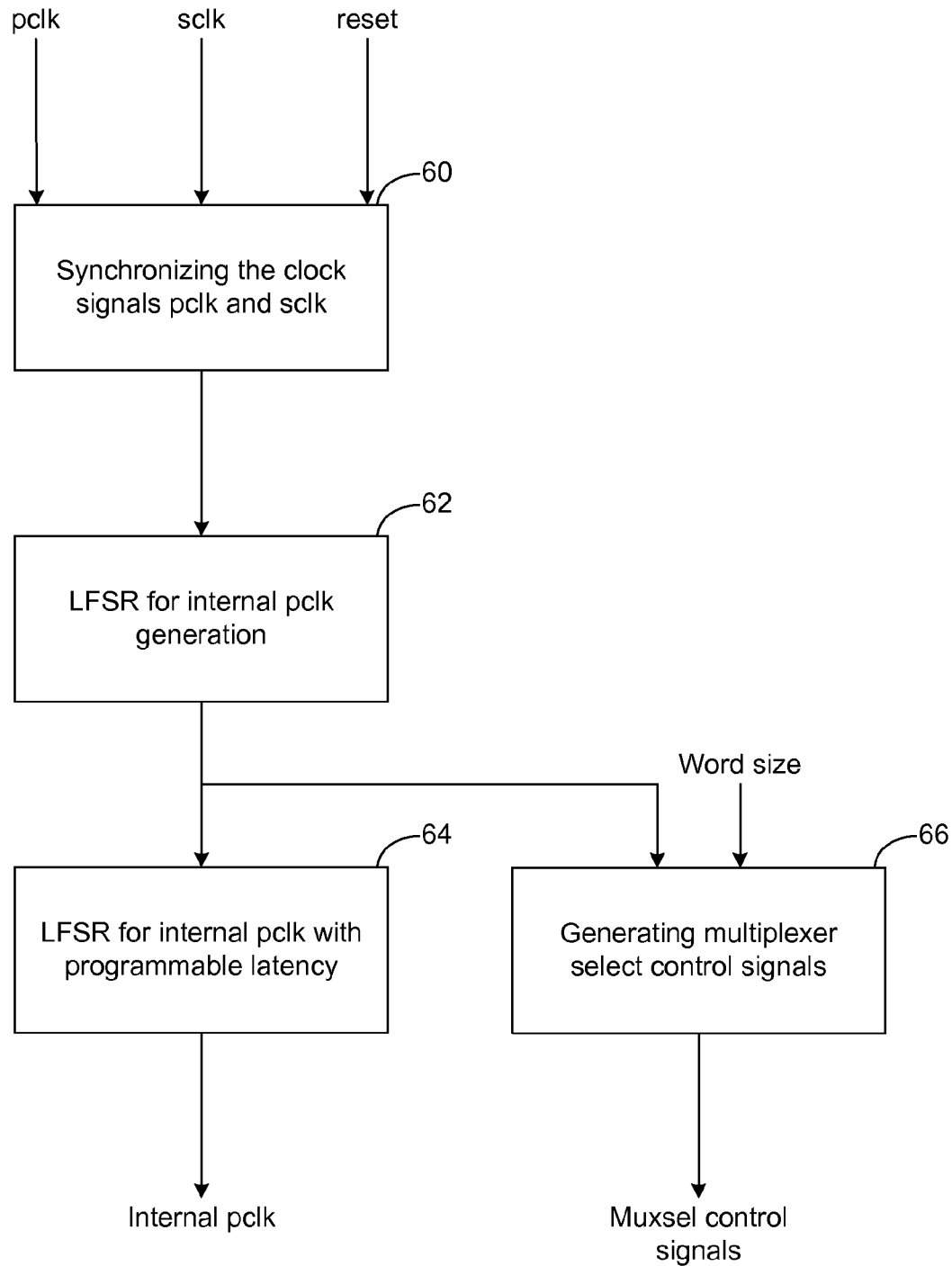
FIG. 4 illustrates a block diagram for generating a programmable latency for a parallel-to-serial converter of the present invention.

FIG. 4 illustrates a block diagram for generating a programmable latency for a parallel-to-serial converter of the present invention. Clock signals pclk and sclk and a control signal reset are inputted into a synchronizing block 60. The clock signal pclk, an external clock to the parallel-to-serial converter, is synchronized with the clock signal sclk to generate an internal clock pclk for the parallel-to-serial converter of the present invention. The internal clock signal pclk can be inputted to the flip-flops of the parallel-to-serial converter of the present invention for latching the inputted word. Next, the internal pclk is inputted to a linear feedback shift register (LFSR) block 62 to identify a best capture time for the parallel data by the flip-flops of the parallel-to-serial converter. The internal pclk is then inputted to a LFSR block 64 so that the capture time can be further adjusted by a user programmable delay for capturing the parallel data. The internal pclk and the word size of the inputted word are also inputted to a block 66 for generating multiplexer select control signals, e.g., muxsel0, muxsel8, muxsel16, and muxsel32, for the multiplexers of the parallel-to-serial converter. The programmable internal pclk from block 64 is inputted to the flip-flops of the parallel-to-serial converter.

Figure 5:
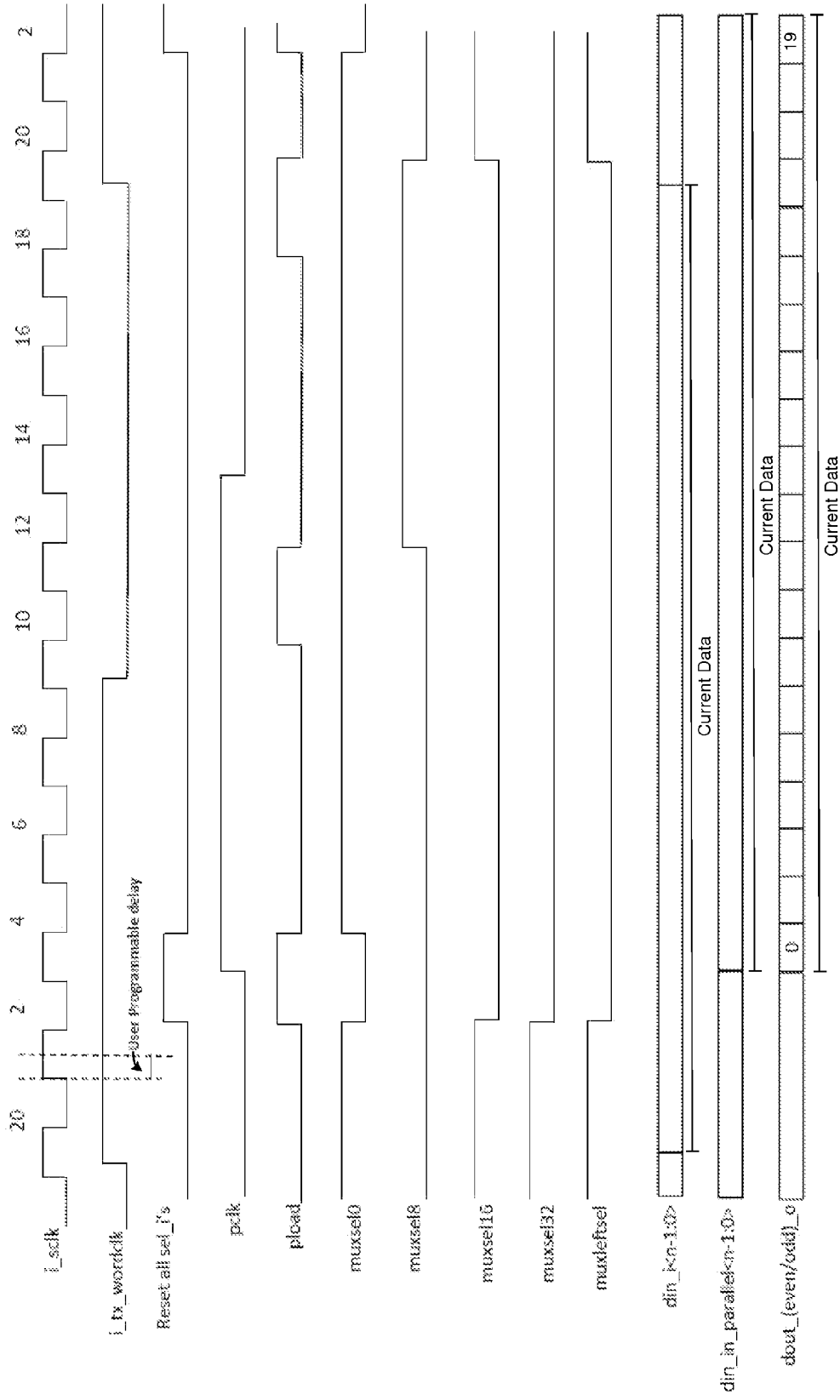
FIG. 5 illustrates a timing diagram of clock signals and control signals for a parallel-to-serial converter of the present invention.

FIG. 5 illustrates a timing diagram of clock signals and control signals for a parallel-to-serial converter of the present invention. In the this example, an input word din_i<n−1:0> has a bit size of 20 bits. The input word can be received as parallel data din in_parallel<n−1:0> and latched to flip-flops of the parallel-to-serial converter according to the clock signal pclk or the clock signal i_tx_wordclk, depending on if the FIFO mode is enabled or not enabled. The serial data dout_(even/odd)_o is serially outputs the 20 bits of the input word according to the clock signal i_sclk.

The mux selection control signals, e.g., muxsel0, muxsel8, muxsel16, muxsel32, and muxleftsel, can be reset to low upon the rising edge of the reset signal, resetall sel_i's signal, after a user programmable delay. The reset signal is high for one cycle of the clock signal i_sclk. Once the muxes are reset, the control signal muxsel0 is de-activated and pload is activated. After the mux selection control signals are reset, the clock signal pclk is generated.

When the control signal muxsel0 is low and the signal pload is high, the first 8 bits of the input word are directly loaded into the shift register of the parallel-to-serial converter to be shifted out. The signal pload transitions from a low to high state to load a segment of the input data into the shift register.

At the falling edge of the pload signal, the mux selection control signals are incremented in a binary fashion for selecting the next segment of the input word to load into the shift register. Upon shifting the loaded bits, the pload signal is activated for loading and shifting of a next segment of the input word. If this is the last segment of data and remaining data is smaller than Z bits, the control signal muxleftsel is activated to directly load the next segment of the input word to the shift register via a multiplexer. The above process can repeat for any other input words.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A method for converting parallel data having a certain word size to serial data, comprising the steps of:
   loading a first segment of a word of the parallel data into a shift register having a first size, and inputting remaining segments of the word into two or more multiplexers connected in series for selecting a next segment of the word;
   selecting the next segment of the word to load into the shift register;
   shifting out the loaded segment of the word in the shift register as serial data output;
   loading the selected next segment of the word into the shift register; and
   repeating the selecting, shifting, and loading the next segment steps until all the remaining segments of the word have been shifted as serial data output,
   wherein a fourth multiplexer is connected between the shift register and the two or more multiplexers for selecting either the first segment or the next segment to load into the shift register.

2. The method of claim 1 wherein each of the multiplexers selects a half of its inputted bits for output and wherein the last serially-connected multiplexer of the multiplexers outputs the next segment to the shift register.

3. The method of claim 1 wherein the multiplexers comprise a first multiplexer, a second multiplexer, and a third multiplexer,
   wherein the remaining segments are inputted into the first multiplexer,
   wherein the first multiplexer selects one-half of the remaining segments to output to the second multiplexer,
   wherein the second multiplexer selects one-half of the selected segments from the first multiplexer to output to the third multiplexer, and
   wherein the third multiplexer selects one-half of the selected segments from the second multiplexer to output as the next segment to the shift register.

4. The method of claim 1 wherein the selecting the next segment step is performed simultaneously with the shifting out the loaded segment step.

5. The method of claim 1 wherein the remaining segments of the parallel data are loaded into flip-flops according to an internal clock, wherein the flip-flops are connected to the multiplexers, and wherein the internal clock has a programmable latency for capturing the remaining segments of a next word.

6. The method of claim 1 wherein control signals are inputted to the multiplexers to select consecutive segments of the word to load into the shift register.

7. The method of claim 1 wherein if the number of bits of the next segment is less than the first size, then the next segment is directly inputted into the fourth multiplexer bypassing the two or more multiplexers.

8. The method of claim 1 wherein the number of the two or more multiplexers is a function of the word size and the first size.

9. The method of claim 1 wherein the number of the two or more multiplexers is determined by the following formula: two to the x power=y, where y=(the word size−the size of the first segment)/the first size.

10. A method for converting parallel data having a certain word size to serial data, comprising the steps of:
    loading a first segment of a word of the parallel data into a shift register having a first size, and inputting remaining segments of the word into two or more multiplexers connected in series for selecting a next segment of the word;

selecting the next segment of the word to load into the shift register;

shifting out the loaded segment of the word in the shift register as serial data output;

loading the selected next segment of the word into the shift register; and repeating the selecting, shifting, and loading the next segment steps until all the remaining segments of the word have been shifted as serial data output, wherein the selecting the next segment step is performed simultaneously with the shifting out the loaded segment step, and wherein a fourth multiplexer is connected between the shift register and the two or more multiplexers for selecting either the first segment or the next segment to load into the shift register.

11. The method of claim 10 wherein the multiplexers comprise a first multiplexer, a second multiplexer, and a third multiplexer, wherein the remaining segments are inputted into the first multiplexer, wherein the first multiplexer selects one-half of the remaining segments to output to the second multiplexer, wherein the second multiplexer selects one-half of the selected segments from the first multiplexer to output to the third multiplexer, and wherein the third multiplexer selects one-half of the selected segments from the second multiplexer to output as the next segment to the shift register.

12. The method of claim 10 wherein the remaining segments of the parallel data are loaded into flip-flops according to an internal clock, wherein the flip-flops are connected to the multiplexers, and wherein the internal clock has a programmable latency for capturing the remaining segments of a next word.

13. The method of claim 10 wherein control signals are inputted to the multiplexers to select consecutive segments of the word to load into the shift register.

14. The method of claim 10 wherein if the number of bits of the next segment is less than the first size, then the next segment is directly inputted into the fourth multiplexer bypassing the two or more multiplexers.

15. The method of claim 10 wherein the number of the two or more multiplexers is a function of the word size and the first size.

16. The method of claim 10 wherein the number of the two or more multiplexers is determined by the following formula: two to the x power=y, where y=(the word size−the size of the first segment)/the first size.

17. A method for converting parallel data having a certain word size to serial data, comprising the steps of:

loading a first segment of a word of the parallel data into a shift register having a first size, and inputting remaining segments of the word into two or more multiplexers connected in series for selecting a next segment of the word;

selecting the next segment of the word to load into the shift register;

shifting out the loaded segment of the word in the shift register as serial data output;

loading the selected next segment of the word into the shift register; and repeating the selecting, shifting, and loading the next segment steps until all the remaining segments of the word have been shifted as serial data output, wherein the selecting the next segment step is performed simultaneously with the shifting out the loaded segment step, wherein the remaining segments of the parallel data are loaded into flip-flops according to an internal clock, wherein the flip-flops are connected to the multiplexers, wherein the internal clock has a programmable latency for capturing the remaining segments of a next word, wherein control signals are inputted to the multiplexers to select consecutive segments of the word to load into the shift register, wherein a fourth multiplexer is connected between the shift register and the two or more multiplexers for selecting either the first segment or the next segment to load into the shift register, and wherein if the number of bits of the next segment is less than the first size, then the next segment is directly inputted into the fourth multiplexer bypassing the two or more multiplexers.

18. The method of claim 17 wherein the multiplexers comprise a first multiplexer, a second multiplexer, and a third multiplexer, wherein the remaining segments are inputted into the first multiplexer, wherein the first multiplexer selects one-half of the remaining segments to output to the second multiplexer, wherein the second multiplexer selects one-half of the selected segments from the first multiplexer to output to the third multiplexer, and wherein the third multiplexer selects one-half of the selected segments from the second multiplexer to output as the next segment to the shift register.

19. The method of claim 17 wherein the number of the two or more multiplexers is determined by the following formula: two to the x power=y, where y=(the word size−the size of the first segment)/the first size.

\* \* \* \* \*